(12) United States Patent
Nakamura et al.

(10) Patent No.: US 9,190,168 B2
(45) Date of Patent: Nov. 17, 2015

(54) MAGNETIC MEMORY AND MANUFACTURING METHOD THEREOF

(75) Inventors: Shiho Nakamura, Kanagawa-ken (JP); Tsuyoshi Kondo, Kanagawa-ken (JP); Hirofumi Morise, Kanagawa-ken (JP); Junichi Akiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 542 days.

(21) Appl. No.: 13/425,471

(22) Filed: Mar. 21, 2012

(65) Prior Publication Data
US 2013/0083595 A1     Apr. 4, 2013

(30) Foreign Application Priority Data
Sep. 30, 2011   (JP) .................. 2011-218675

(51) Int. Cl.
G11C 11/14   (2006.01)
G11C 19/08   (2006.01)

(52) U.S. Cl.
CPC ............................... G11C 19/0808 (2013.01)

(58) Field of Classification Search
CPC ...................................... G11C 11/00; G11C 11/14
USPC ......... 365/48, 55, 62, 66, 74, 78, 80–93, 100, 365/130, 131, 148, 158, 171–173, 209, 213, 365/225.5, 230.07, 232, 243.5
See application file for complete search history.

(56) References Cited

U.S. PATENT DOCUMENTS

| | | | |
|---|---|---|---|
| 6,834,005 B1 | 12/2004 | Parkin | |
| 6,898,132 B2 | 5/2005 | Parkin | |
| 7,372,757 B2 | 5/2008 | Shin et al. | |
| 2004/0252538 A1* | 12/2004 | Parkin | 365/80 |
| 2004/0252539 A1* | 12/2004 | Parkin | 365/80 |
| 2005/0078509 A1* | 4/2005 | Parkin | 365/158 |
| 2005/0078511 A1* | 4/2005 | Parkin | 365/171 |
| 2005/0094427 A1* | 5/2005 | Parkin | 365/80 |
| 2005/0226043 A1* | 10/2005 | Parkin et al. | 365/173 |
| 2006/0104110 A1* | 5/2006 | Sun et al. | 365/173 |
| 2006/0120132 A1* | 6/2006 | Parkin | 365/80 |

(Continued)

FOREIGN PATENT DOCUMENTS

| | | |
|---|---|---|
| JP | 2009-508353 | 2/2009 |
| JP | 2010-016060 | 1/2010 |

(Continued)

OTHER PUBLICATIONS

Nikkei Electronics, May 14, 2005, pp. 26-27.

(Continued)

*Primary Examiner* — Harry W Byrne
(74) *Attorney, Agent, or Firm* — Amin, Turocy & Watson, LLP

(57) ABSTRACT

A magnetic memory includes a first magnetic line, an electrode, a write-in portion, a second magnetic line, and a spin-wave generator. The first magnetic line has a plurality of magnetic domains and domain walls, the domain wall separating the magnetic domain. The electrode is provided to both ends of the first magnetic line. The write-in portion is provided adjacent to the first magnetic line. The second magnetic line is provided so that the second magnetic line intersects with the first magnetic line. The spin-wave generator provided to one end of the second magnetic line. The spin-wave detector provided to the other end of the second magnetic line.

20 Claims, 18 Drawing Sheets

(56) References Cited

U.S. PATENT DOCUMENTS

2007/0297218 A1* 12/2007 Abraham et al. ............. 365/158
2010/0046268 A1* 2/2010 Moriya et al. ................. 365/80
2010/0075599 A1 3/2010 Xi et al.

FOREIGN PATENT DOCUMENTS

JP 2010-062342 3/2010
WO 2011-033640 3/2011

OTHER PUBLICATIONS

Yamaguchi, A., et al.; "Real-Space Observation of Current Driven Domain Wall Motion in Submicron Magnetic Wires", Physical Review Letters, vol. 92, No. 7, Feb. 20, 2004.

Office Action of Notification of Reasons for Rejection for Japanese Patent Application No. 2011-218675 Dated Jan. 9, 2015, 9 pages.

* cited by examiner

MAGNETIC MEMORY AND MANUFACTURING METHOD THEREOF

CROSS REFERENCE TO RELATED APPLICATION

This application is based upon and claims the benefit of priority from the prior Japanese Patent Application No. 2011-218675, filed on Sep. 30, 2011, the entire contents of which are incorporated herein by reference.

FIELD

Embodiments relate basically to a magnetic memory including a magnetic line which has magnetic domains each being walled by domain walls and having information recorded.

BACKGROUND

In recent years, there has been an observation report that a single domain wall was driven by an electric current. There is proposed a magnetic memory capable of shifting a domain wall on the basis of the current drive. In the disclosures, a domain wall is moved by a current in a magnetic line. The magnetic line has a magnetic structure which is divided into two or more magnetic domains, thereby enabling a magnetic recording device having a similar magnetic structure to a magnetic tape. Such a magnetic memory is increasingly required of large memory capacity due to high density of cells.

There has been proposed a read-out method for a domain-wall motion type memory in the background art. The method provides a CPP-GMR or TMR element to a read-out unit of the magnetic line. On the other hand, there has been also proposed another read-out method employing Cu or Al wiring on the basis of induced electromotive force.

BRIEF DESCRIPTION OF THE DRAWINGS

Aspects of this disclosure will become apparent upon reading the following detailed description and upon reference to the accompanying drawings.

DESCRIPTION

Figure 1A:
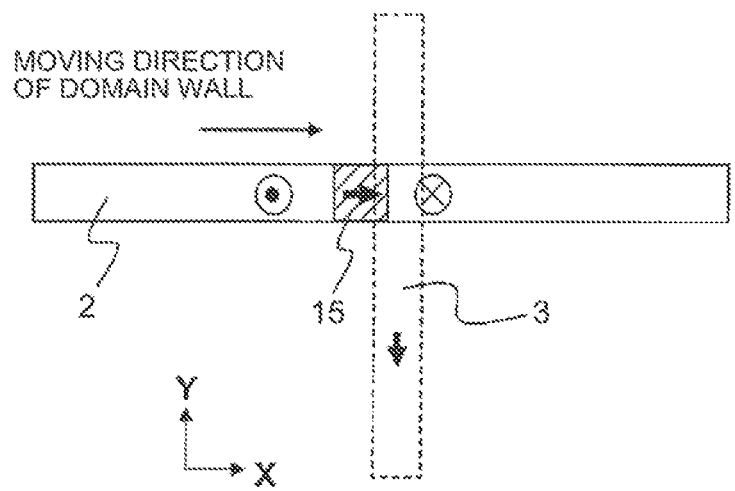
FIG. 1A is a view showing an arrangement of a memory line, a detection line, a Neel wall, and a current direction.

As will be described later, in accordance with an embodiment, a magnetic memory includes a first magnetic line, an electrode for current supply (also called electrode), a write-in portion, a second magnetic line, and a spin-wave generator. The first magnetic line has a plurality of magnetic domains and domain walls, the domain wall walling (separating) the magnetic domain. The electrode is provided to both ends of the first magnetic line. The write-in portion is provided adjacent to the first magnetic line. The second magnetic line is provided so that the second magnetic line intersects with the first magnetic line. The spin-wave generator provided to one end of the second magnetic line. The spin-wave detector provided to the other end of the second magnetic line.

A detection principle of the domain wall in accordance with an embodiment will be described below.

Several types of domain wall have been known. The types include a longitudinal domain wall, a closure-domain type wall, a Bloch wall, and a Neel wall. The longitudinal domain wall appears in a magnetic line having an in-plane easy axis of magnetization. The Bloch wall and the Neel wall appear in a magnetic line having a perpendicular easy axis of magnetization. It is also known that a domain wall changes its structure to move. For example, in a magnetic line with a perpendicular easy axis, the Bloch wall and the Neel wall appear by turns to move.

The inventors found out the following. When a domain wall appear to move in a memory line (a first magnetic line) 2 having a perpendicular easy axis, magnetization of a detection line (a second magnetic line) 3 transiently tilts in the longitudinal direction of the memory line 2. Here, the detection line 2 has magnetization in its longitudinal direction and intersects with the memory line 2. The above transient tilt of the magnetization does not depend on whether a domain wall in the detection line 3 is a Bloch wall or a Neel wall.

Next, a calculation will be provided. A memory line and a detection line intersected with each other with a space of 4 nm therebetween. The memory line measured 32 nm wide by 4 nm thick and had saturation magnetization Ms=1100 emu/cc with a perpendicular easy axis of magnetization and perpendicular magnetic anisotropy Ku=1E7 erg/cc. The detection line measured 32 nm wide by 4 nm thick and saturation magnetization Ms=800 emu/cc with an in-plane easy axis of magnetization and shape magnetic anisotropy. A magnetization state of the detection line was calculated on the basis of the following LANDAU-LIFSHITZ-GILBERT equation when a domain wall was introduced to the memory line and a current was passed through the memory line to move the domain wall.

$$\frac{dm}{dt} = -\gamma_0 m \times H_{\mathit{eff}} + \alpha m \times \frac{dm}{dt} - (u \cdot \nabla)m + \beta m \times [(\mu \cdot \nabla)m]$$ [Formula 1]

$$u = (gP\mu_B/2eM_s)j.$$

Here, m, t, $H_{\mathit{eff}}$, γ, α, β, Ms, P denote magnetization, time, an effective magnetic field, a gyromagnetic constant, a GILBERT's damping constant (attenuation constant), nonadiabatic spin torque coefficient, saturation magnetization, and spin polarization, respectively. The structure of the domain walls passing over the detection line 3 was regulated by changing a current to probe both a Bloch wall and a Neel wall.

Figure 1B:
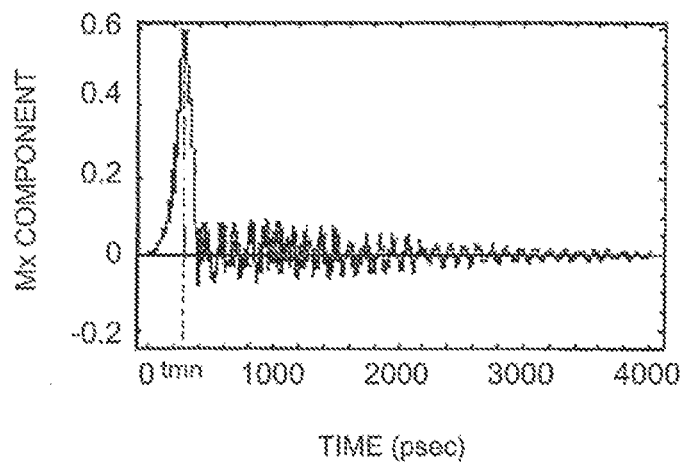
FIG. 1B is a graph showing a magnetization of a portion of the detection line versus time, the portion being immediately above the memory line when the Neel wall is passing over the detection line.

FIG. 1A is a view showing the memory line 2, the detection line 3 immediately above the memory line 2, and the Neel wall 15 with the current direction, the moving direction of the Neel wall when the Neel wall is passing over the detection line 3. FIG. 1B is a graph showing a x component (component in the x-axis direction) Mx of magnetization of the detection line 3 versus time. The graph reveals that Mx transiently peaks around the time tmn at which the Neel wall passes immediately under the detection line 3.

Figure 2A:
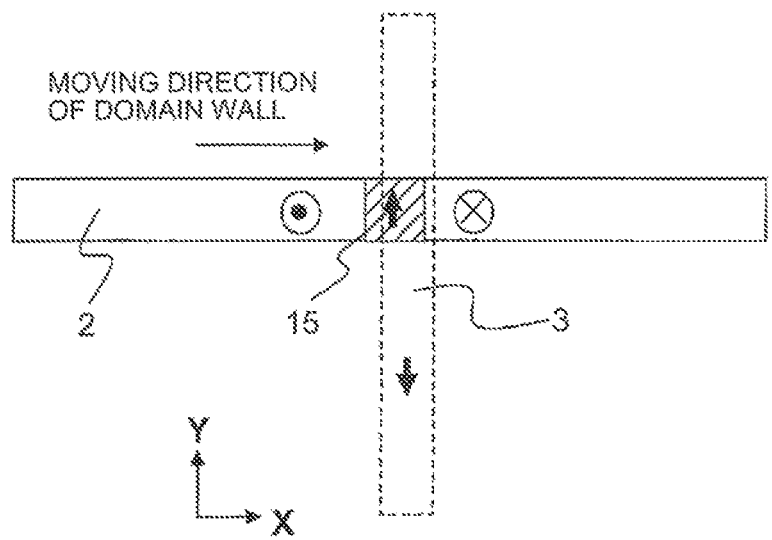
FIG. 2A is a view showing an arrangement of a memory line, a detection line, a Bloch wall, and a current direction.
Figure 2B:
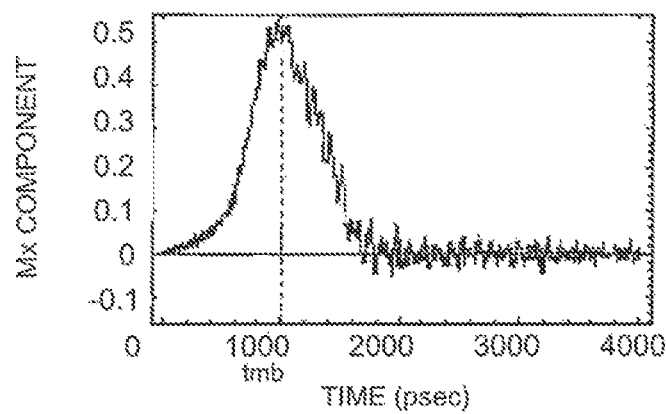
FIG. 2B is a graph showing a magnetization of a portion of the detection line versus time, the portion being immediately above the memory line when the Bloch wall is passing over the detection line.

FIG. 2A is a view showing the memory line 2, the detection line 3 immediately above the memory line 2, and the Bloch wall 15 with the current direction, the shift direction of the Neel wall when the Bloch wall is passing over the detection line 3. FIG. 2B is a graph showing a x component (component in the x-axis direction) Mx of magnetization of the detection line 3 versus time. The current in FIG. 2B is one fourth that in FIG. 1B. The graph reveals that Mx transiently peaks around the time tmn at which the Bloch wall is passing immediately under the detection line 3. FIG. 2B shows a similar tendency to FIG. 1B, although the domain wall structures are different from each other in FIGS. 1B and 2B. In addition, a difference is seen between the peak widths in FIGS. 1B and 2B. However, this difference is not intrinsic to the domain wall structure, since the width depends on the velocity of the domain wall which is determined by the amount of the current flowing in the memory line 2.

Figure 3:
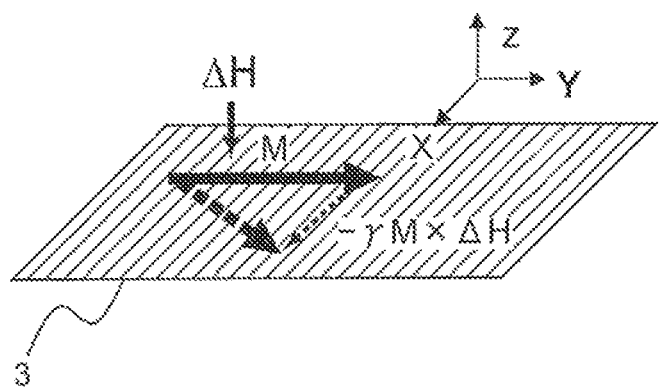
FIG. 3 is a schematic view showing force $-\gamma M \times \Delta H$ acting on the magnetization M of the detection line, $\Delta H$ being a change in a stray magnetic field in the z direction from the memory line.

FIG. 3 is a schematic view showing force −γMΔH acting on the magnetization M of the detection line, ΔH being a change in a stray magnetic field in the z direction from the memory line. The tendency can be understood in terms of a magnetization tilt in the x direction in the detection line 3. The magnetization of the memory line changes around a domain wall. The magnetization change causes a change ΔH in a stray magnetic field in the z direction. The change ΔH acts on the detection line 3 as shown in FIG. 3 so that the force −γM×ΔH acts on the magnetization of the detection line 3. As a result, the magnetization of the detection line 3 tilts in the x direction. A stray magnetic field from the domain wall does not directly change the magnetization of the detection line, but a change in the magnetization around the domain wall changes the magnetization of the detection line. For this reason, the response of the x component Mx of the detection line 3 is independent of the domain wall structure.

When the memory line 2 has an in-plane easy axis of magnetization, no change ΔH in a stray magnetic field in the z direction is caused by the in-plane magnetization film around the passage of a domain wall through the detection line 3. Therefore, the magnetization of the detection line does not tilt in the x direction at all.

A change in the x component Mx of magnetization of the detection line 3 modulates propagation of a spin wave. Detecting the modulation enables it to estimate the passage of a domain wall, i.e., to read out information recorded in the memory line 2.

Figure 4:
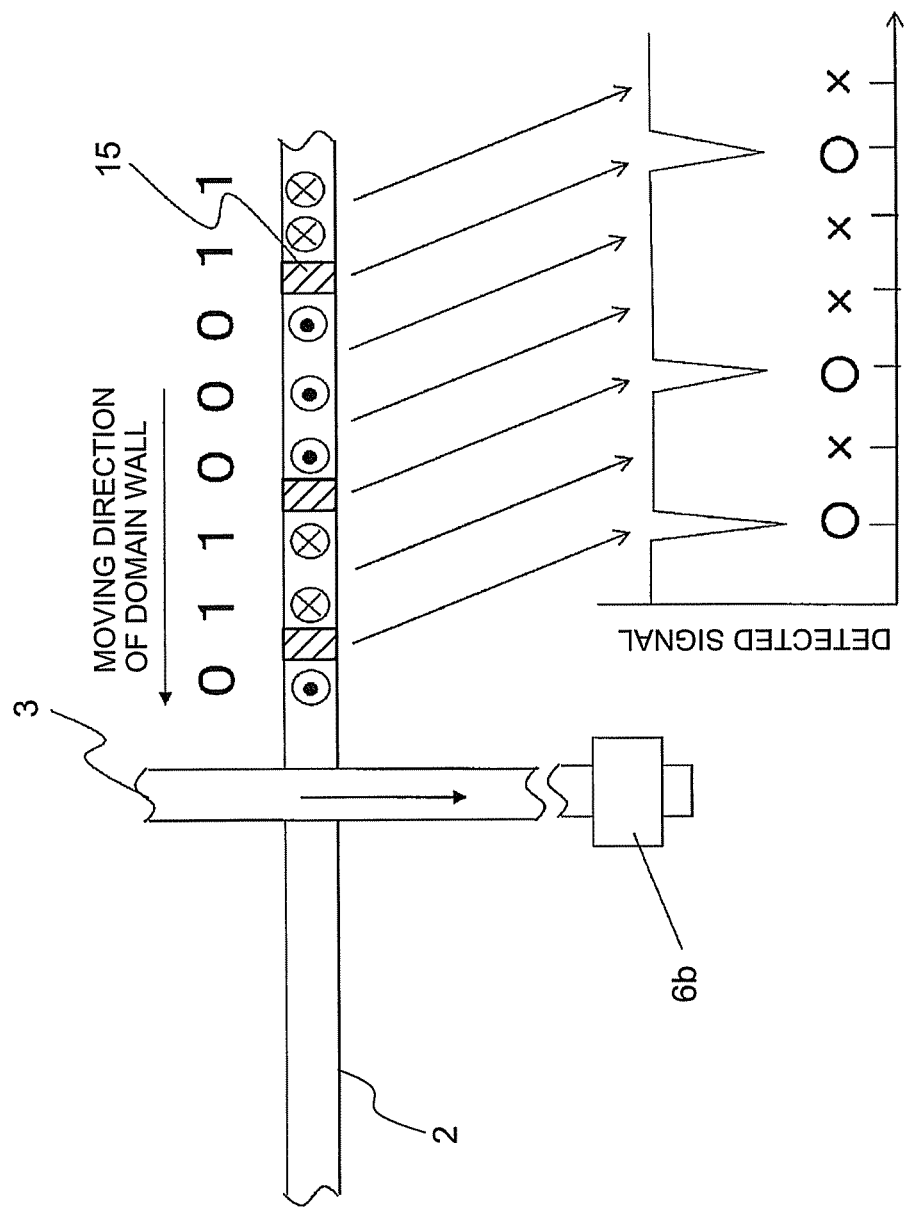
FIG. 4 is a schematic view showing an operation basis of the magnetic memory.

For example, when an 8-bit signal 01100011 is recorded as shown in FIG. 4, presence or absence of a domain wall between the two adjacent bits is denoted by o and x to provide a notation of (oxoxxox). FIG. 4 is a schematic view showing an operation basis of the magnetic memory. When the domain walls are sent to the left side of the memory line 2, variations in a detected signal level by a spin-wave detector 6b show the presence of the domain walls. Determining a first bit signal in advance enables it to reproduce signals.

Preferable widths of the memory line and the detection line will be described below.

Figure 5A:
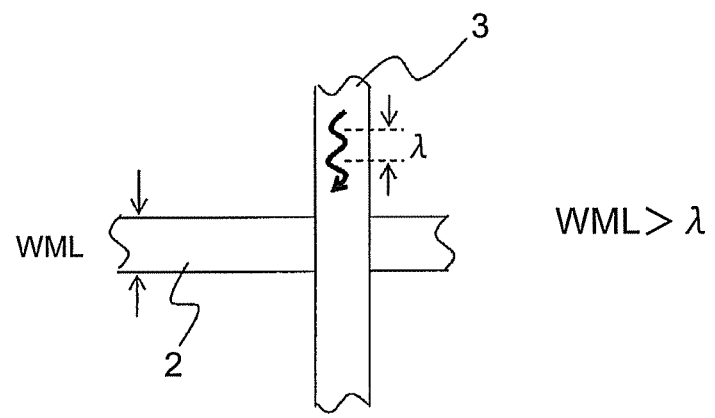
FIGS. 5A and 5B are schematic views showing a relation between the line width wML of the memory line and the wavelength of a spin wave, the spin wave propagating along the detection line.
Figure 5B:
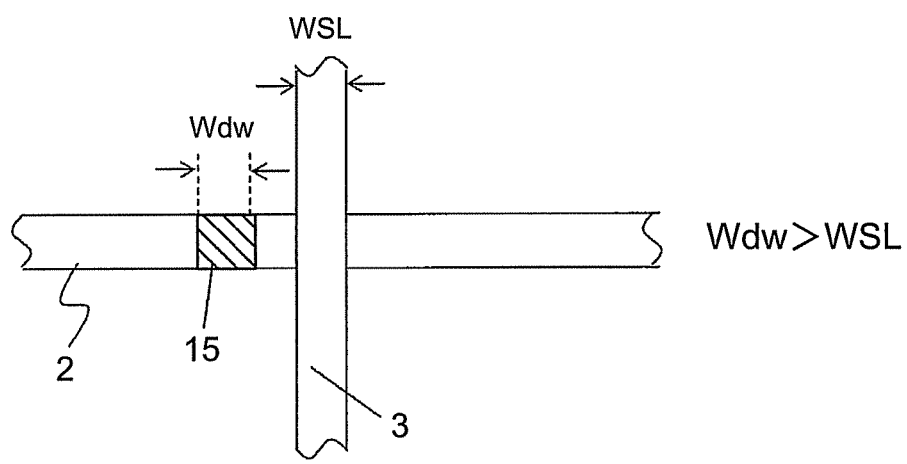

FIGS. 5A and 5B are schematic views showing a relation between the line width wML of the memory line and the wavelength of a spin wave, the spin wave propagating along the detection line. It is preferable that a line width wML of the memory line is larger than the wavelength of a spin wave propagating along the detection line, as shown in FIG. 5A. In that case, the modulation of the spin wave is easy to capture. The wavelength of a spin wave can be estimated from a dispersion relation of the spin wave in addition to an optical observation method such as a micro-Brillouin scattering method. The dispersion relation is derived using an excitation frequency, saturation magnetization Ms, a magnetic anisotropy constant Ku, a shape, and a size of the memory line.

Figure 6:
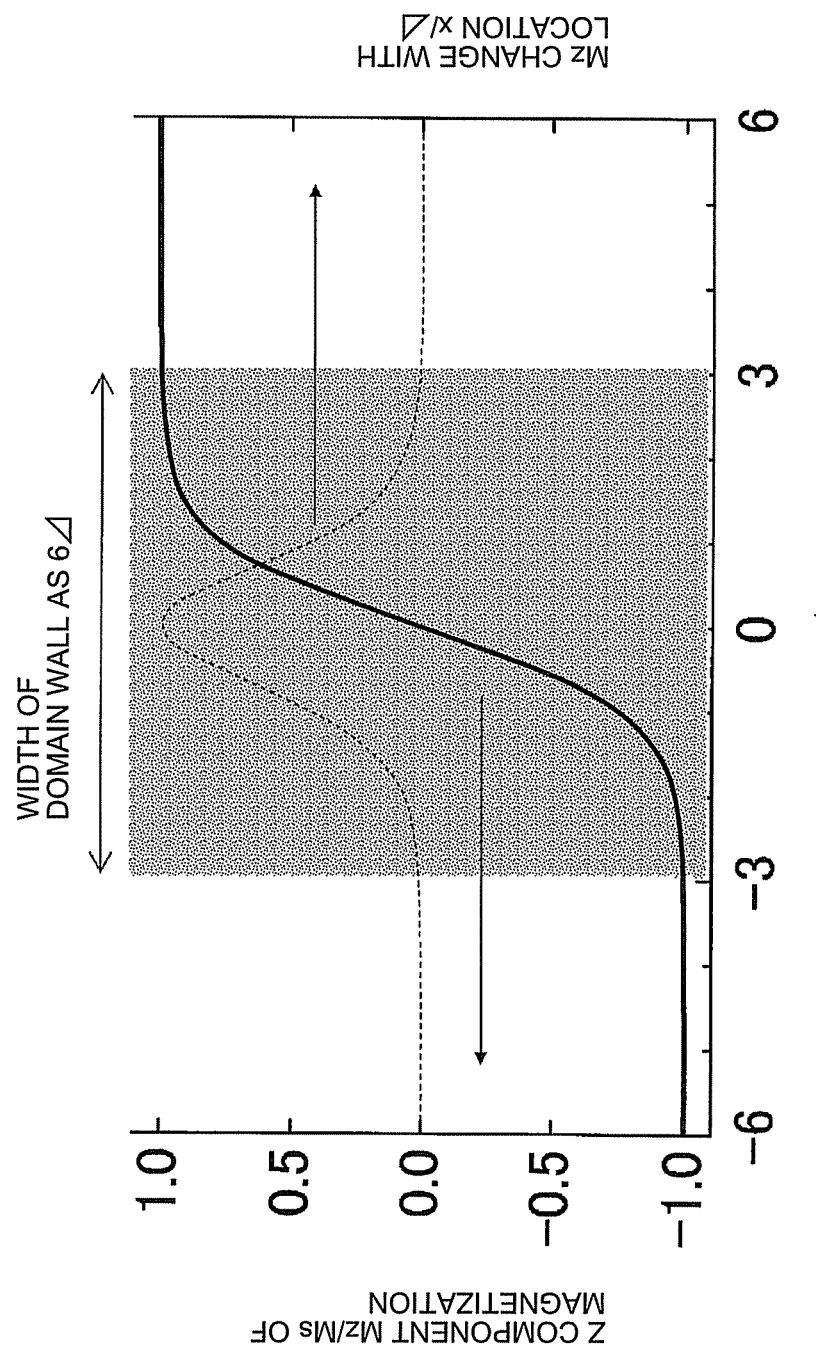
FIG. 6 is a view showing a z-component Mz/Ms of the magnetization around a domain wall.

It is also preferable that the width wSL of the detection line is smaller than the width wdw of the domain wall 15, as shown in FIG. 5B. FIG. 6 is a view showing a z-component Mz/Ms of the magnetization around a domain wall. The position dependence of the Mz/Ms around a domain wall can be commonly approximated by a hyperbolic tangent of Mz=tan h(x/Δ) when placing a center of the domain wall on an origin of the x-axis coordinate. When x of the hyperbolic tangent exceeds ±3Δ, the hyperbolic tangent goes into a constant region, i.e., constant magnetization. A width of a domain wall is defined approximately as being 6Δ from the view point of the spin-wave modulation. Experimentally, Δ can be estimated by fitting a measured result of the change of the magnetic force or the magnetization direction to tan h(x/Δ). The change of the magnetic force or the magnetization direction is measured by using a magnetic force microscope, a spin-polarized scanning electron microscope, a spin-polarized scanning tunnel microscope, and the like. Alternatively, the domain wall width may be acquired with a simulation using material and shape parameters.

Materials applicable to the memory line and the detection line will be described below.

A metallic material is employed for the memory line. Magnetization of the metallic material has an easy axis of magnetization perpendicular to a plane. The plane is located at the cross point of the memory line and the detection line and is parallel to both the memory and detection lines. A preferable material has perpendicular magnetization anisotropy. The anisotropy preferably originates from high magnetic anisotropy energy. Examples of the material will be described below.

(1) Disordered Alloy

The examples of the perpendicularly magnetizable material with crystal magnetic anisotropy include Co-based alloys containing at least one element selected from the group consisting of Fe, Ni, C, Cr, Ta, Nb, V, W, Hf, Ti, Zr, Pt, and Pd. The Co-based alloys include a CoCr alloy, a CoPt alloy, a CoCrTa alloy, a CoCrPt alloy, a CoCrPtTa alloy, and a CoCrNb alloy. It is possible to adjust magnetic anisotropy energy and saturation magnetization of these alloys by increasing the content of nonmagnetic elements.

(2) Ordered Alloy

At least one element selected from the group consisting of Fe, Co, and Ni is alloyed with one or two of Pt and Pd, thereby providing $L_{10}$ type ordered alloys, for example. The $L_{10}$ type ordered alloys include $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$. The ordered alloys are not limited to the above-mentioned alloy compositions. It is possible to control magnetic anisotropy energy and saturation magnetization of these alloys by adding impurities such as Cu, Cr, Ag, and etc.

(3) Laminated Film

A laminated film has a structure with a first layer and a second layer laminated alternately. The first layer is a metal layer or an alloy layer containing at least one element selected from the group consisting of Fe, Co, and Ni. The second layer is a metal layer or an alloy layer containing at least one element selected from the group consisting of Pd, Ir, Rh, Ru, Os, Re, Au, Ag, Cu, Cr, and Co. Examples of the laminated film include a Ni/Co/Pt laminated film, a Co/Pd laminated film, a Co/Ru laminated film, a CoNi/Au laminated film, a Ni/Co laminated film, a NiCu/Co laminated film, and a NiCu/Pd laminated film. It is possible to adjust magnetic anisotropy energy and saturation magnetization of these laminated films by adding impurities to the first layer or changing the thickness ratio of the first layer to the second layer.

(4) Ferrimagnetic Material

A ferrimagnetic material can be an alloy containing a rare earth metal and a transition metal. The examples of the rare earth metal include at least one element selected from the group consisting of Tb (terbium), Dy (dysprosium), and Gd (gadolinium). The examples of the transition metal include an amorphous alloy containing one or more transition metals. Examples of the ferrimagnetic material include TbFe, TbCo, TbFeCo, DyTbFeCo, GdTbCo, and GdFeCo. It is possible to adjust magnetic anisotropy energy and saturation magnetization of these alloys by controlling alloy compositions.

The above-mentioned materials (1) to (4) are employed in combination with each other like TbFeCo/NiFe and GdFeCo/CoFeB to allow it to adjust pinning force to a domain wall.

Materials for the detection line include a metallic material, a semiconductor material, and an insulating material, all of which has an easy axis of magnetization in its longitudinal direction. Examples of the materials will be described below.

(5) Disordered Alloy

Disordered alloys include a metal or an alloy both containing at least one element selected from the group consisting of Fe, Co, and Ni. Examples of the disordered alloys include a NiFe alloy, a NiFeCo alloy, and a CoFeB alloy. These alloys are disordered or amorphous in structure and easy to prepare.

(6) Oxide

Oxide containing Fe can be employed for the detection line. Oxide exhibiting semiconductivity or insulation properties has few conduction electrons to allow it to prevent a spin wave from attenuating. Employing yttrium iron Garnett or yttrium gallium iron Garnett $Y_3Fe_{5-x}Ga_xO_{12}$ (x<5) can provide a spin wave with excellent propagation properties.

The material (5) or (6) is formed as a layer for the detection line with an antiferromagnetic layer adjacent to the layer, thereby enabling it to fix the magnetization direction of the detection line. This is preferable for controlling magnetization.

Embodiments will be described below.

First Embodiment

Figure 7:
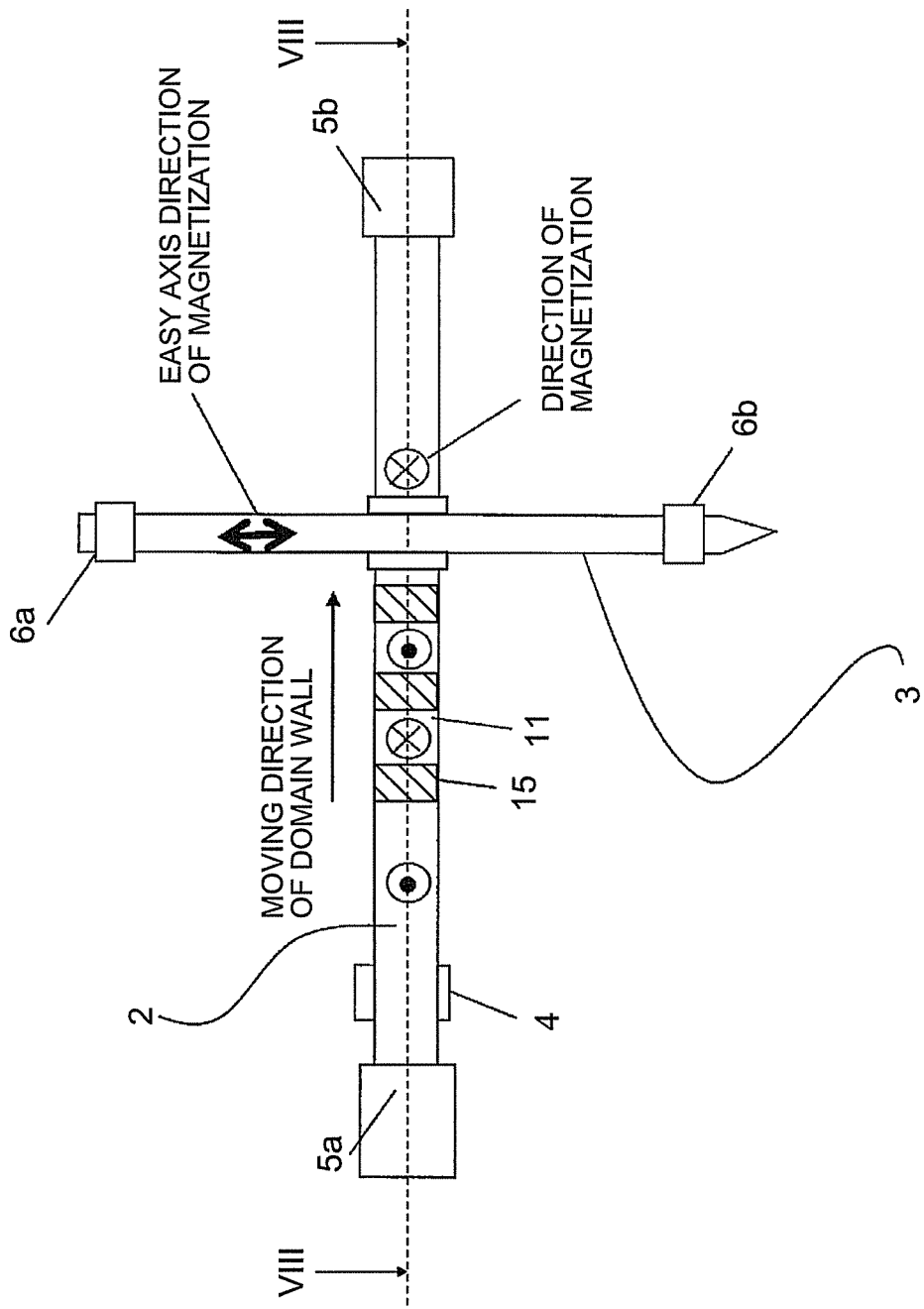
FIG. 7 is a schematic top view showing a magnetic memory in accordance with a first embodiment.
Figure 8:
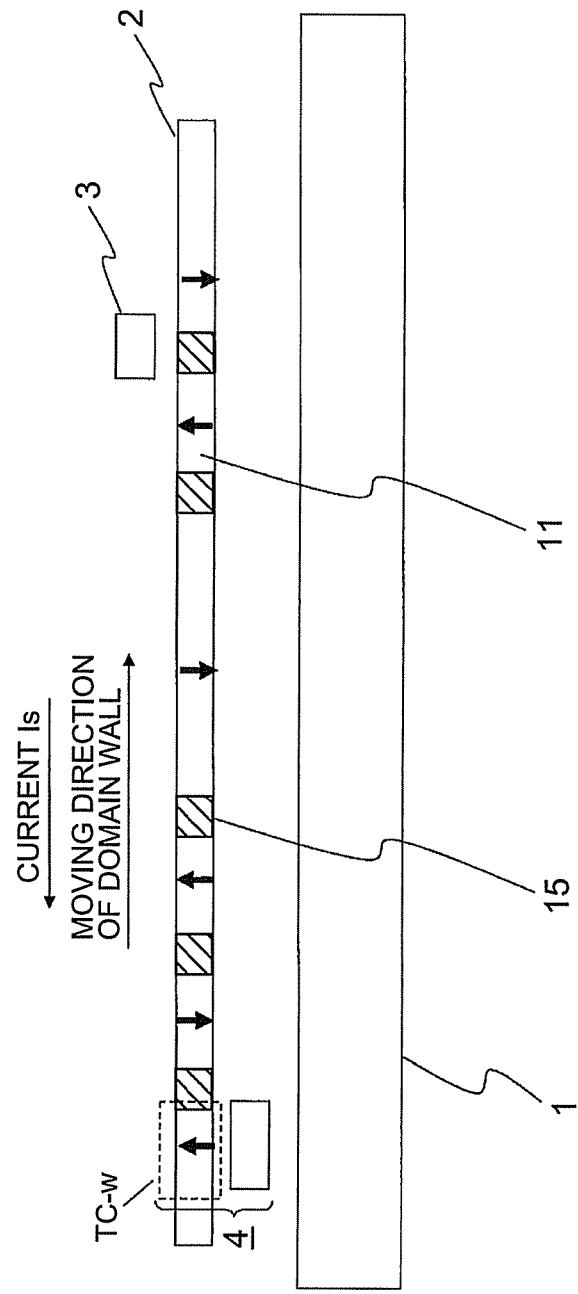
FIG. 8 is a schematic sectional view cut along VIII-VIII line of FIG. 7.

FIGS. 7 and 8 are schematic views showing a magnetic memory in accordance with a first embodiment. FIG. 7 is a top view of the magnetic memory. FIG. 8 is a sectional view cut along VIII-VIII line of FIG. 7.

As shown in FIG. 8, a memory line (a first magnetic line) 2 is arranged as a memory element above a semiconductor substrate 1. As shown in FIG. 7, a detection line (a second magnetic line) 3 is arranged to intersect with the memory line 2. The magnetization of the memory line 2 has an easy axis perpendicular to a plane 2a. The magnetization of the detection line 3 has an easy axis in its longitudinal direction. The plane 2a is located at the cross point of the memory line 2 and the detection line 3 and is parallel to both the memory line 2 and the detection line 3.

The memory line includes two or more magnetic domains whose magnetization directions are perpendicular to the plane 2a. The magnetic domains are walled by two or more domain walls 15. The magnetization direction in each of the magnetic domains 11 is assigned with "1" or "0." If each of the magnetic domains 11 can be regarded as a memory cell, information of "1" or "0" can be recorded into each cell. If two adjacent cells have the same information, no domain wall is generated between the two adjacent cells. However, the first embodiment will be described for convenience with an assumption that a domain wall is constantly present between the two adjacent cells.

The memory line 2 is a line and has a section being rectangular, square, ellipsoidal, or circular. A notch may be provided at regular intervals so that the notch corresponds to a domain wall.

A write-in portion 4 is provided to a portion of the memory line 2. The write-in portion 4 determines the magnetization direction of a targeted cell TC-w to write in data.

Figure 9A:
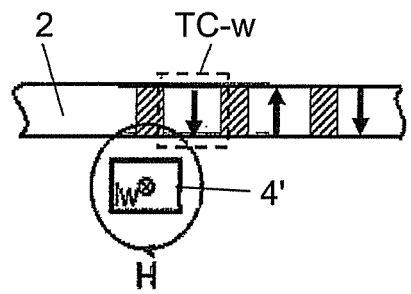
FIGS. 9A to 9D are views showing configurations of a write-in portion.
Figure 9B:
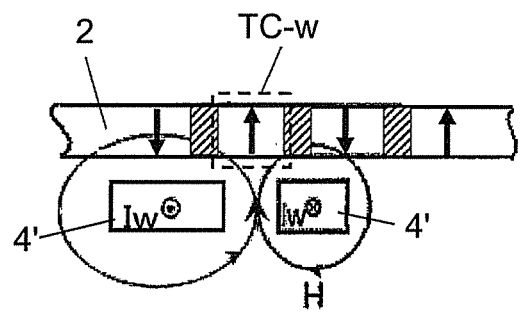

FIGS. 9A to 9D are views showing configurations of a write-in portion. As shown in the views, the write-in portion 4 includes a metal line 4' which is separated from the memory line 2 and intersects with the memory line 2. On writing in, a current Iw is passed through the metal line 4'. The current Iw generates a magnetic field to be applied to the targeted cell TC-w. The targeted cell TC-w is located at one end of the memory line 2. As a result, the magnetization direction of the targeted cell TC-w is determined to write data therein. In FIG. 9A, the metal line 4' is a single line. In FIG. 9B, the metal line 4' is a double line (including back and forth lines). The double line can determine the size of a targeted cell by a gap dimension between the back and forth lines. Therefore, it is possible to design the size of a memory cell by a dimensional precision for working the double line and is, therefore, preferable.

Figure 9C:
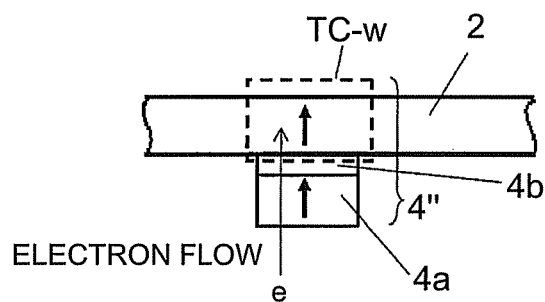
Figure 9D:
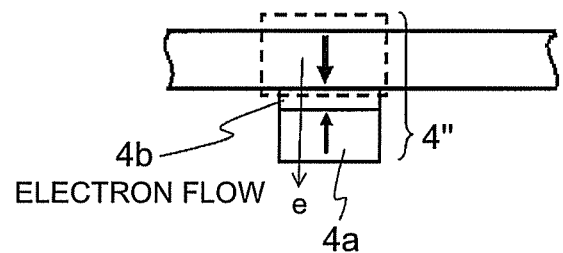

A spin torque writing element is employed for a write-in portion, as shown in FIGS. 9C and 9D. In FIGS. 9C and 9D, a magnetic electrode 4a is provided to the targeted cell TC-w via an intermediate layer 4b including a nonmagnetic metal or a tunnel barrier. The magnetization direction of the magnetic electrode 4a is perpendicular to the intermediate layer 4b. On writing in, an electron flow (in a direction opposite to that of an electric current) is passed between the magnetic electrode 4a and the memory line 2. The magnetization direction of the targeted cell TC-w is determined depending on the direction of the electron current, thereby writing in data.

Current lead-in electrodes 5a and 5b (as shown in FIG. 7) are provided to both ends of the memory line 2. The electrode 5b is connected to a current supply (not shown). A current Is supplied from the current supply moves domain walls located between the electrodes 5a and 5b. In addition, the moving direction of a domain wall is opposite to the direction in which the current Is passes.

Figure 10:
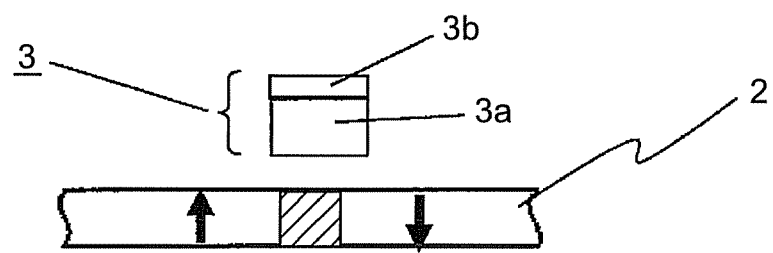
FIG. 10 is a view showing a configuration of the detection line.

The detection line 3 is provided to be directly or indirectly in contact with the memory line 2 and intersect therewith. The detection line 3 can employ an insulating magnetic material or a conducting magnetic material. The detection line 3 employing the insulating magnetic material is provided to be directly or indirectly in contact with the memory line 2. The detection line 3 employing the conducting magnetic material is provided to be in contact with the memory line 2 via an insulating layer. The easy axis of magnetization of the detection line 3 is aligned in the longitudinal direction of the detection line 3. It is preferable for the detection line 3 to have a single direction of magnetization. Accordingly, as shown in FIG. 10, the detection line 3 is provided with a ferromagnetic layer 3a and an antiferromagnetism layer 3b to have unidirectional anisotropy, thereby leading to excellent controllability. In addition, one end of the detection line 3 is shaped as being V-shaped as shown in FIG. 7, thereby allowing it to prevent a spin wave from being reflected at the end.

One end of the detection line 3 is provided with a spin-wave generator 6a to generate a spin wave. The spin wave propagates along the detection line 3.

Figure 11A:
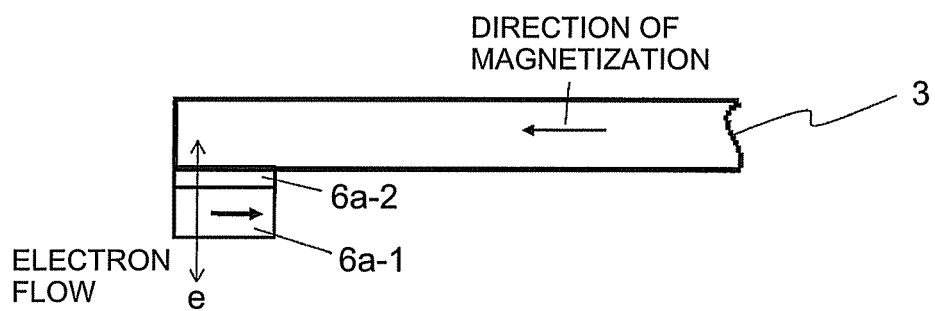
FIGS. 11A to 11C are views showing configurations of a spin-wave generator.
Figure 11B:
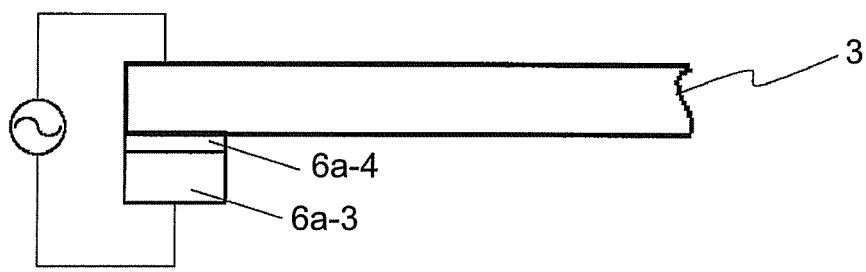
Figure 11C:
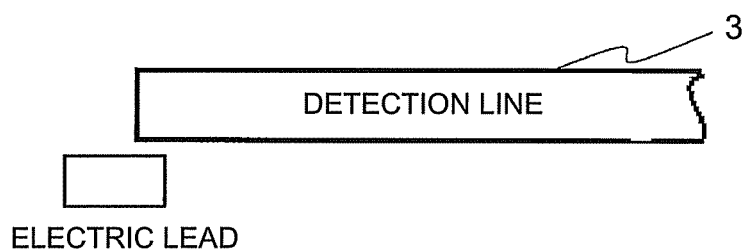

FIGS. 11A to 11C are views showing configurations of a spin-wave generator. As shown in FIG. 11A, a magnetization oscillation element due to spin torque can be employed for the spin-wave generator 6a, for example. In FIG. 11A, a magnetic electrode 6a-1 is provided to the spin-wave generator 6a via an intermediate layer 6a including a nonmagnetic layer. The magnetization direction of the magnetic electrode 6a-1 is parallel to the intermediate layer 6a-2. A direct current or an alternate current having the oscillation frequency is passed between the detection line 3 and magnetic electrode 6a-1, thereby generating a precession of magnetization in the spin-wave generator 6a.

Alternatively, an electrode layer 6b-3 may be provided to the detection line 3 via an insulating layer 6b-4, as shown in FIG. 11B. In the alternative method, a voltage having the oscillation frequency is applied by the end of the detection line 3, thereby enabling it to modulate the magnetic anisotropy to excite a spin wave. The alternative method consumes no current to enable it to efficiently generate a spin wave, thereby contributing to low power consumption.

As shown in FIG. 11C, a lead 6a-5 may be provided to the spin-wave generator 6a so that the lead 6a-5 is perpendicular to the detection line 3. Passing an alternate current (AC) through the lead 6a-5 generates a precession of the magnetization of the spin-wave generator 6a.

The spin wave excited at one end of the detection line 3 propagates toward another end of the detection line 3. The inventors have found out the following by themselves. When a domain wall in the memory line 2 passes under the detection line 3 passing an alternate current therethrough, the spin wave propagating along the detection line 3 and having magnetization in the longitudinal direction of the detection line 3 is modulated independently of the type of the domain walls in the memory line 2. The principle of the modulation has been described above.

The spin-wave detector 6b is provided to another end of the detection line 3 to convert a spin wave into an electrical signal.

Figure 12A:
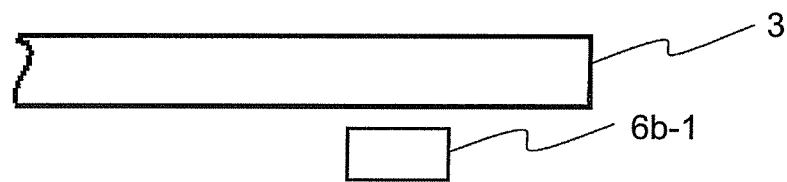
FIGS. 12A to 12C are views showing configurations of a spin-wave detector.
Figure 12B:
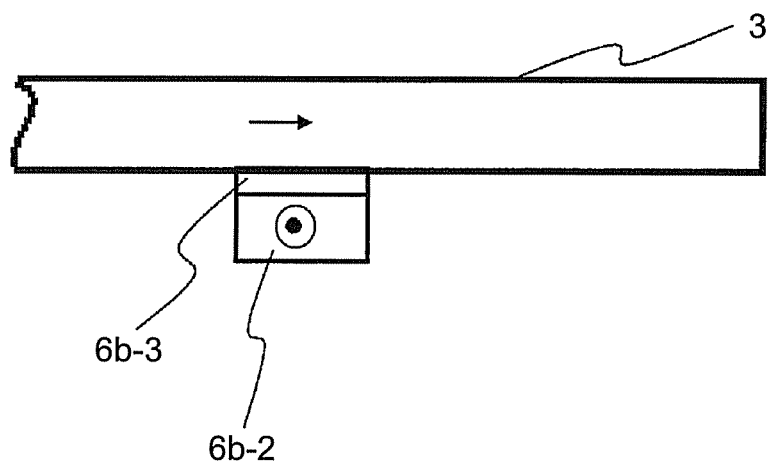
Figure 12C:
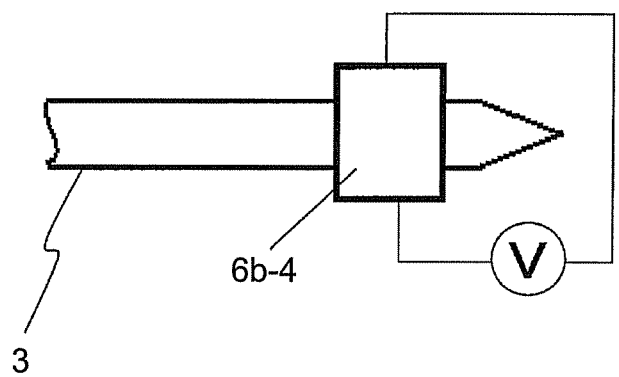

FIGS. 12A to 12C are views showing configurations of a spin-wave detector. As shown in FIG. 12A, a lead 6b-1 is provided to the spin-wave detector 6b in contact with or not in contact with the detection line 3, thereby enabling it to detect induced electromotive force due to a spin wave in the lead 6b-1. As shown in FIG. 12B, a lead 6b-2 is provided to the spin-wave detector 6b via a tunnel barrier 6b-3, thereby enabling it to use a TMR effect. Furthermore, as shown in FIG. 12C, a voltage-conversion layer 6b-4 is provided in contact with the detection line 3, thereby measuring a voltage due to a spin pumping effect and an inverse spin Hall effect. The spin pumping effect and the inverse spin Hall effect appear between a magnetic material including a precession of magnetization and the voltage conversion layer 6b-4. Measuring the voltage enables it to detect a signal of spin wave as an electric signal. It is preferable to use large mass elements including platinum, gold, and iridium for the voltage conversion layer 6b-4.

Examples of this embodiment will be described below.

Example 1

Figure 13A:
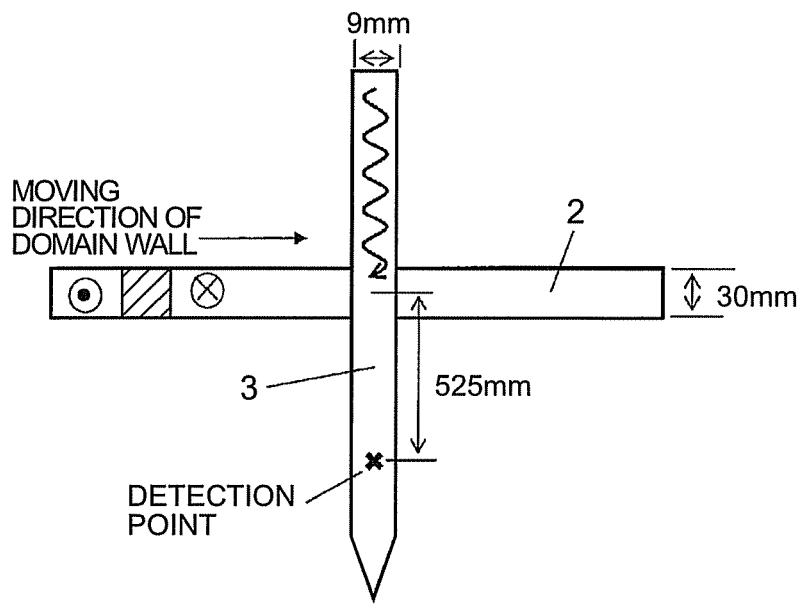
FIG. 13A is a top view of the magnetic memory of an example 1.
Figure 13B:
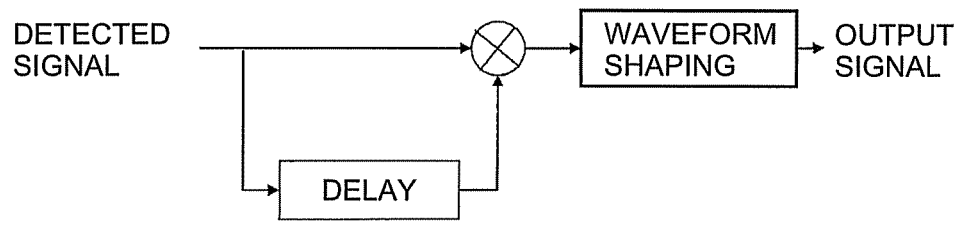
FIG. 13B is a circuit diagram for converting a detected signal into a signal of a phase change by using a delay line.

FIG. 13A is a top view of the magnetic memory of this example. As shown in FIG. 13, a detection line was arranged above a memory line to intersect with the memory line. The memory line has magnetization of 800 emu/cc and perpendicular magnetic anisotropy energy of $1 \times 10^7$ erg/cc. The detection line has magnetization of 800 emu/cc and an easy axis of the magnetization in its longitudinal direction. The above-mentioned configuration was examined by means of micromagnetics simulation for whether or not a spin wave propagating along the detection line enabled it to detect a domain wall passing through the memory line.

A spin wave was beforehand introduced to one end of the detection line at 50 GHz as shown in FIG. 13A. At the same time, a current of $1 \times 10^8$ A/cm$^2$ was passed through the memory line to move a domain wall. A detector was arranged at a point located at 525 nm away from the cross point between the memory line and the detection line. A spin wave propagating in the detection line was detected at the point as time dependence of magnetization. Furthermore, the time dependence of magnetization, i.e., a detected signal was converted into a signal of a phase change by the use of a delay detection circuit shown in FIG. 13B to detect a phase change of the spin wave. At first, the detected signal was divided into two signals. Subsequently, one of the two signals was delayed through a delay line by 20 ps to multiply the one by the other with a mixer. Here, 20 ps corresponds to a time interval of one cycle at the frequency of the spin wave.

Figure 13C:
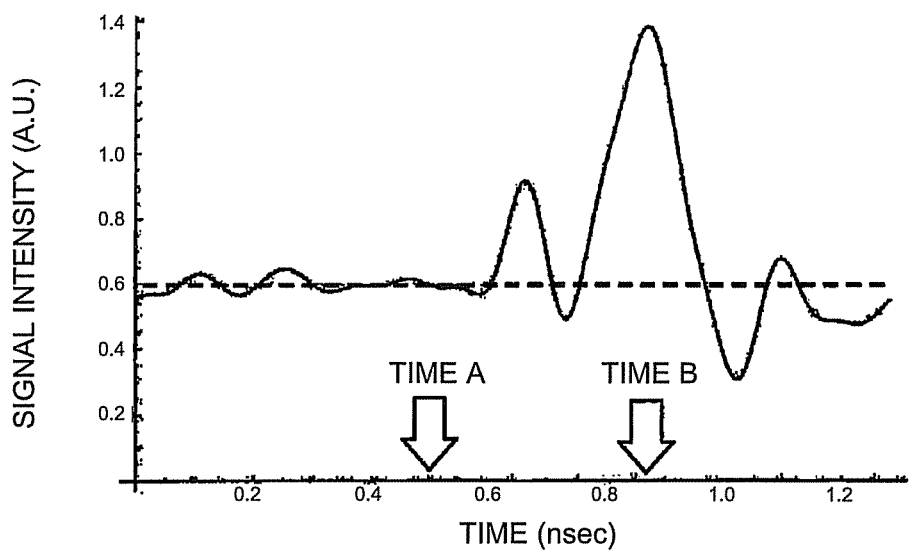
FIG. 13C is a time dependence of the output signal intensity, showing a phase change of the spin-wave.

The two signals multiplied were rectified with a diode and passed through a 10 GHz lowpass filter to undergo waveform shaping processing. The processing allows it to reveal a phase change with time. The simulation result is shown in FIG. 13C. FIG. 13C is a time dependence of the output signal intensity, which corresponds to the phase change of the spin-wave. In the graph, the time A denotes a time for the domain wall to pass over the detection line and the time B denotes a time for the spin wave modulated by the passage of the domain wall to reach to the detection point. In the graph, the signal intensity did not change so much in a time zone where a spin wave had not reached yet but peaked at the time B. As a result, the graph revealed that the phase of the spin wave was modulated by the passage of the domain walls.

Example 2

Figure 14A:
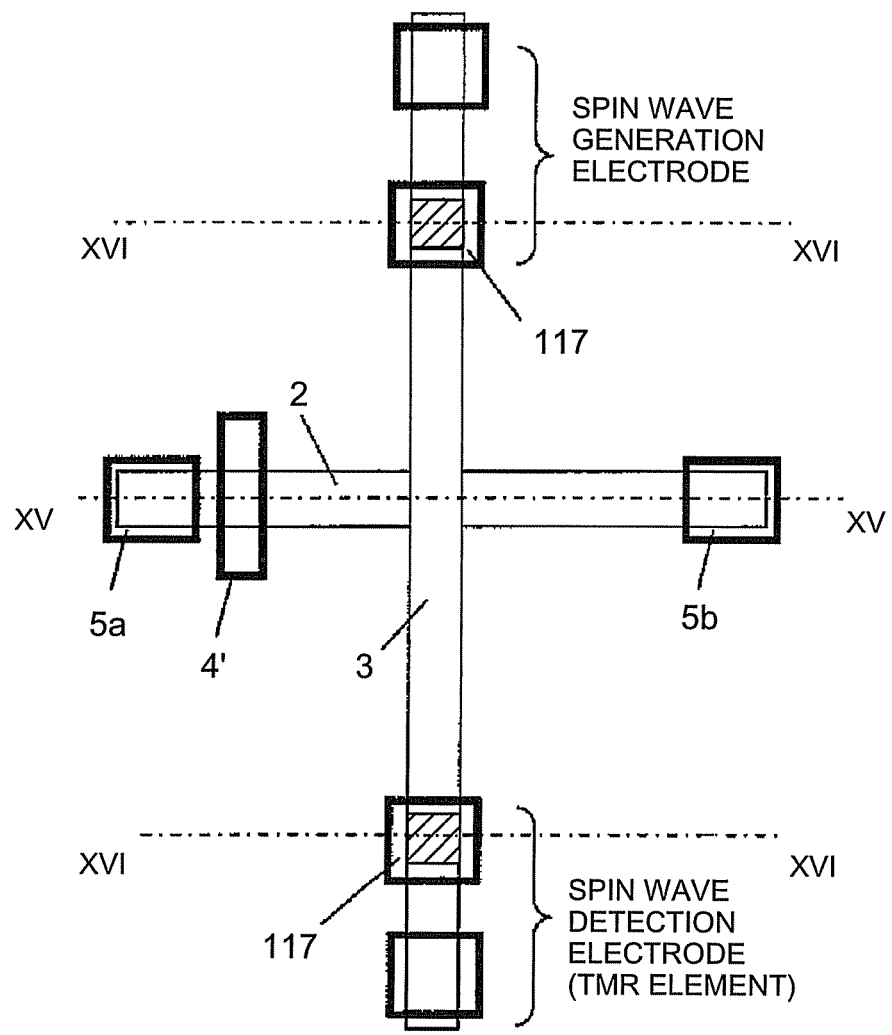
FIG. 14A is a top view showing the magnetic memory to be manufactured by a manufacturing method of an example 2.
Figure 14B:
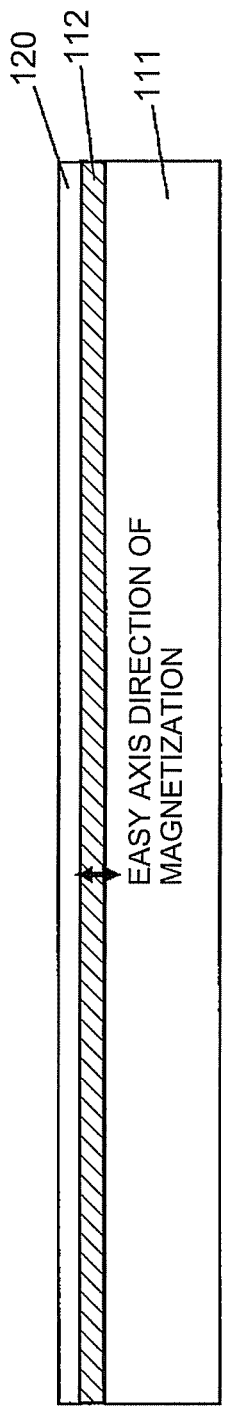
FIG. 14B is a sectional view showing a perpendicular magnetization film with a protective layer.
Figure 14C:
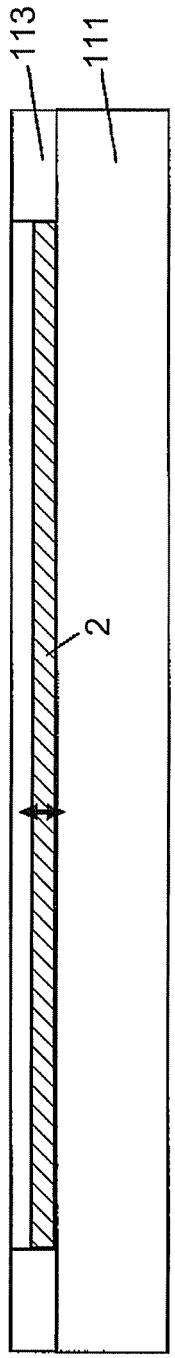
FIG. 14C is a sectional view showing the memory line of the perpendicular magnetization film.
Figure 14D:
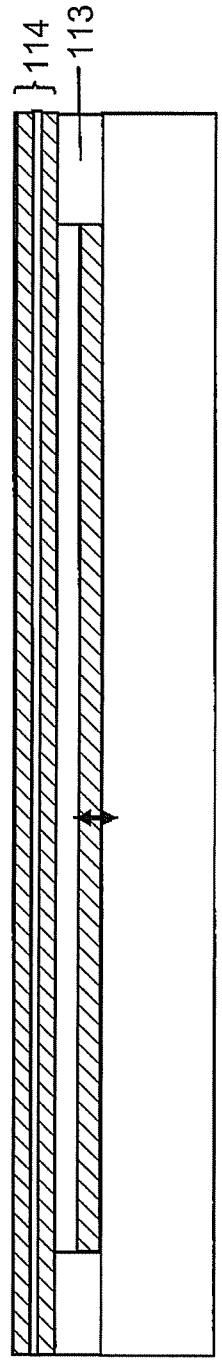
FIG. 14D is a sectional view showing a laminated film further prepared on the resultant surface.
Figure 15:
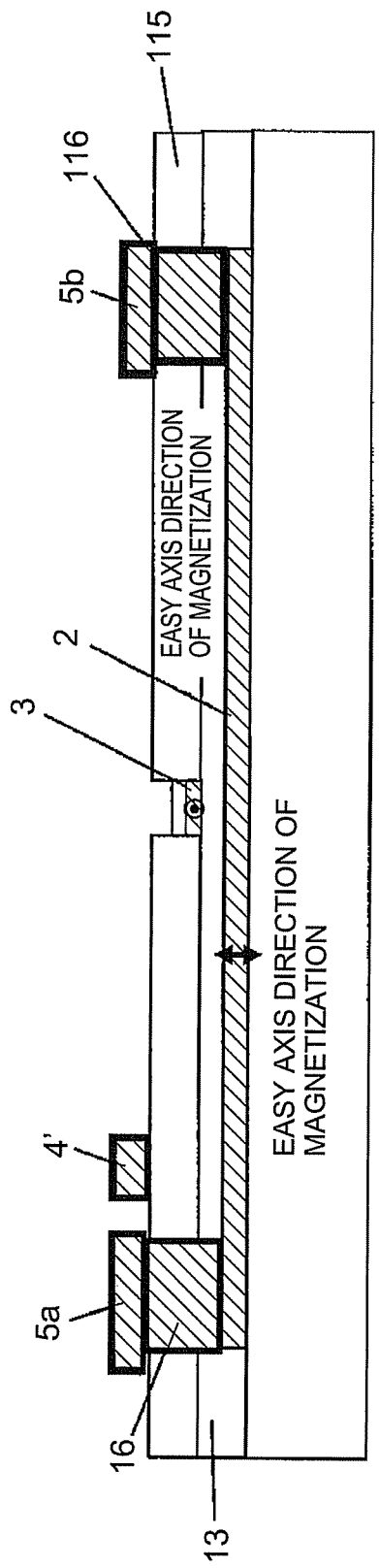
FIG. 15 is a sectional view cut along the XV-XV line in FIG. 14A.
Figure 16:
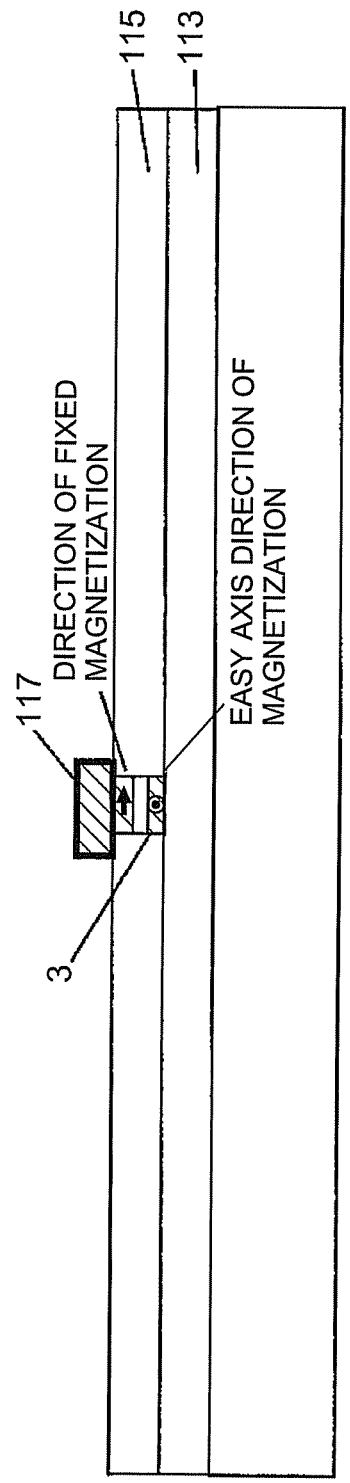
FIG. 16 is a sectional view cut along the XVI-XVI line in FIG. 14A.

A manufacturing method of the magnetic memory of this embodiment will be described below with reference to FIGS. 14A to 16. FIG. 14A is a top view showing the magnetic memory to be manufactured by a manufacturing method of an example 2. FIG. 15 is a sectional view cut along the XV-XV line in FIG. 14A. FIG. 16 is a sectional view cut along the XVI-XVI line in FIG. 14A.

Firstly, a Si substrate 111 with a thermally-oxidized film is loaded into an ultrahigh-vacuum sputtering system. Secondly, a perpendicular magnetization film 112 including [Co (0.3 nm)/Ni (0.9 nm)]×4/Co (0.3 nm) is formed on the Si substrate 111 via a buffer layer. Furthermore, a protective layer 120 including an insulator is formed on the Co/Ni layer. FIG. 14B is a sectional view showing the perpendicular magnetization film 112 with the protective layer 120.

Thirdly, resist is applied on the protective layer 120 and exposed to an electron beam with an electron beam drawing system. The exposed resist is developed and removed to provide a line mask. The mask is used for ion milling to form a magnetic line. Fourthly, a nonmagnetic insulator layer 113 is formed on the magnetic line. Subsequently, the mask on the magnetic line is removed to provide a memory line 2 as shown in FIG. 14C.

Fifthly, a laminated film 114 is formed on the resultant surface. The laminated film includes CoFeB(4 nm)/MgO/[CoFeB(2 nm)/CoFe(2 nm)/IrMn (8 nm)] as shown in FIG. 14D. Furthermore, resist is applied on the above resultant surface and exposed to an electron beam with an electron beam drawing system. The exposed resist is developed and removed to provide a line mask on the laminated film 114. The mask is used for ion milling to form a line on the laminated film 114. Then, a nonmagnetic insulator layer 115 is formed on the line. Subsequently, the mask on the magnetic line is removed.

Sixthly, resist is reapplied on the above resultant surface and exposed to an electron beam to draw mask patterns on areas predetermined for a spin-wave generator and a spin-wave detector. Portions not covered with the masks are etched so that [CoFeB (2 nm)/CoFe (2 nm)/IrMn (8 nm)] included in the laminated layer 114 is removed by ion milling to expose the top surface of the MgO layer to the air, thereby providing a detection line 3 including CoFeB (4 nm). The detection line 3 is to be a transmission line and a spin-wave detector.

Seventhly, as shown in FIGS. 15 and 16, a current lead-in via hole 116 is formed by mask-forming and ion milling followed by depositing a film of an electrode material. Then, the following portions are formed. The following portions include upper electrodes 5a, 5b connected to the current lead-in via hole 116, a write-in line 4', electrodes 117 onto MTJs (Magnetic Tunnel Junction) for generating and detecting a spin wave. Finally, the whole resultant substrate 111 mentioned above is heat-treated in a magnetic field to fix the magnetization of magnetization fixed layers in a direction perpendicular to the longitudinal direction of the detection line 3. The magnetization fixed layers are included in the MTJs at both ends of the detection line 3.

As described above, domain walls are moved along the memory line 2 for write-in and a spin wave is simultaneously excited in the detection line 3. After the spin wave excited passes over the memory line 2, the state of the spin wave can be detected.

Second Embodiment

A second embodiment is provided with two or more memory lines of the first embodiment. The same points as the first embodiment will not be repeated in the second embodiment.

Figure 17:
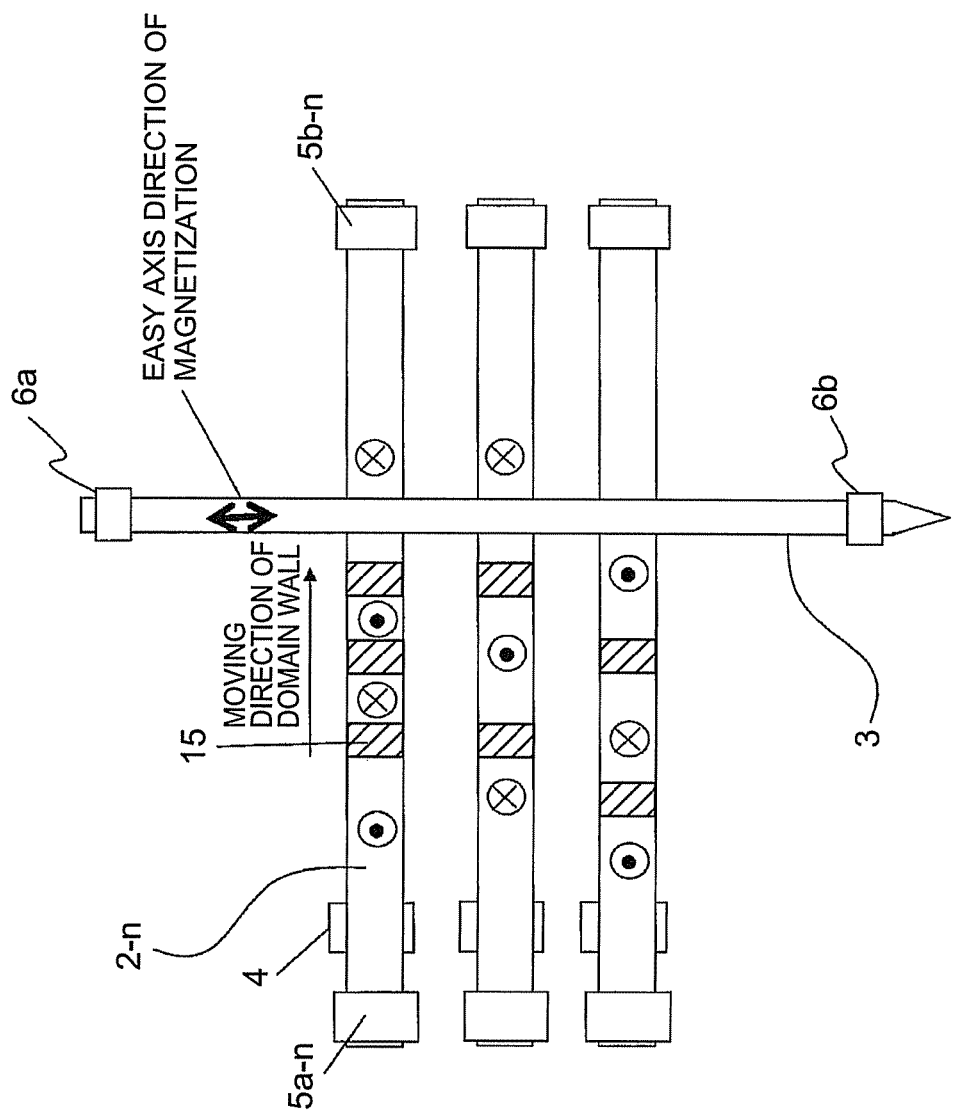
FIG. 17 is a top view of a magnetic memory in accordance with a second embodiment.

FIG. 17 is a top view showing a magnetic memory in accordance with the second embodiment. As shown in FIG. 17, the second embodiment differs from the first embodiment in the following point. That is, two or more memory lines 2-$n$ ($n$ denotes a natural number of 1 or more; first magnetic wires) and a detection line 3 (second magnetic wire) are provided so that the detection line 3 intersects with the memory lines 2-$n$. The memory lines 2-$n$ have an easy axis of magnetization perpendicular to a plane. The plane is located at the cross points of the memory lines and the detection line and is parallel to both the memory and detection lines.

Each of the memory lines 2-$n$ is provided with a current lead-in electrode to move a domain wall. Each of the memory lines 2-$n$ is also provided with a write-in portion 4 to introduce a domain wall. The write-in portion 4 can employ a metal line 4' for writing by a current-induced magnetic field or a spin torque write-in element 4" for writing by spin torque as described in the first embodiment. In FIG. 17, two or more write-in portions 4 can be connected to each other for writing by a current-induced magnetic field. It is preferable that the memory lines 2-$n$ are preferably parallel to each other for high density recording.

The detection line 3 is provided so that the detection line 3 intersects with the memory lines 2-$n$. The detection line 3 has an easy axis of magnetization in its longitudinal direction. It is sufficient that each of the spin-wave generator 6a and the spin-wave detector 6b is provided to the end of the detection line 3.

In the second embodiment, each memory line need not be provided with its dedicated detection line. Instead it is sufficient that a single detection line is provided to the memory lines. The single detection line is capable of reproducing a signal, thereby enabling it to substantially simplify a configuration of the magnetic memory and increase a memory capacity thereof at low cost.

Third Embodiment

Figure 18:
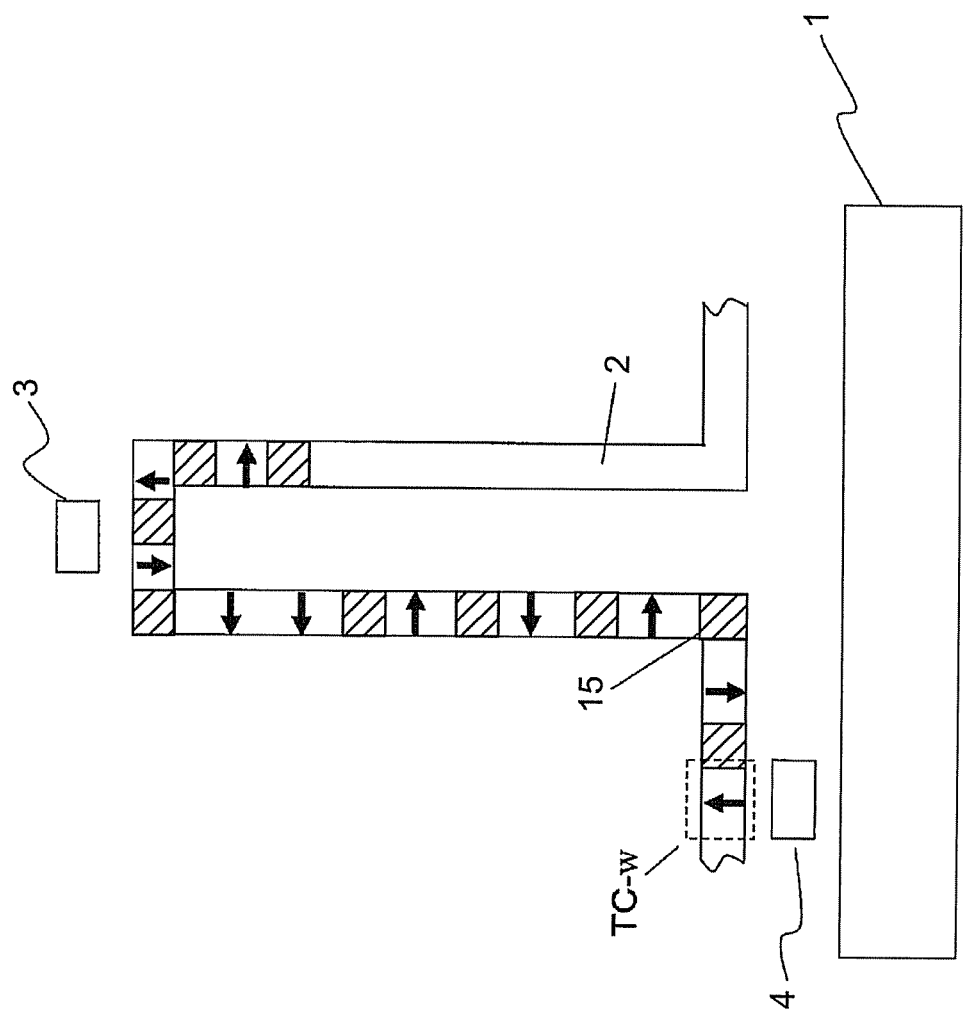
FIG. 18 is a top view of a magnetic memory in accordance with a third embodiment.

A magnetic memory in accordance with a third embodiment will be described below. FIG. 18 is a top view showing the magnetic memory in accordance with the third embodiment.

As shown in FIG. 18, the third embodiment differs from the first embodiment in that a U-shaped memory line is provided above the surface of the semiconductor substrate 1. When a write-in portion 4 is connected to an IC (not shown) on the semiconductor substrate 1, the write-in portion 4 is preferably provided to an end portion of the memory line 2 so that the write-in portion 4 is located between the end portion and the semiconductor substrate 1. The detection line 3 is preferably provided to a central top portion of the inverted U-shaped memory line 2 or an end portion of the memory line 2.

The third embodiment can provide the same effect as the first embodiment. Furthermore, the third embodiment enables it to downsize a cell in the transverse direction of the cell and to provide a large memory capacity on the basis of high density.

Two or more U-shaped memory lines are arranged to be parallel to each other and a single detection line 3 common to the U-shaped memory lines is provided, thereby allowing it to simplify the array configuration in the similar manner as in the second embodiment.

While certain embodiments of the invention have been described, these embodiments have been presented by way of example only, and are not intended to limit the scope of the inventions. Indeed, the novel elements and apparatuses described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A magnetic memory, comprising:
    a plurality of magnetic memory lines, respectively, having a plurality of magnetic domains and domain walls, the domain wall separating the magnetic domain;
    a pair of electrodes provided to both ends of each of the magnetic memory lines, the pair of electrodes to flow a current in each of the magnetic memory lines so as to move the domain walls;
    a write-in portion provided adjacent to each of the magnetic memory lines;
    a magnetic detection line provided so that the magnetic detection line intersects with each of the magnetic memory lines, the magnetic detection line having a single direction of magnetization;
    a spin-wave generator provided to one end of the magnetic detection line, wherein a spin wave generated by the spin-wave generator propagates along the magnetic detection line; and
    a spin-wave detector provided to the other end of the magnetic detection line, the spin-wave detector to detect the spin wave, the spin-wave detector to convert the spin wave into an electrical signal.

2. The memory according to claim 1, wherein
    each of the magnetic memory lines has an easy axis of magnetization in a direction perpendicular to a plane, the plane being located at a cross point of each of the magnetic memory lines and the magnetic detection line, the plane being parallel to each of the magnetic memory lines and the magnetic detection line, the magnetic detection line having an easy axis of magnetization in a longitudinal direction thereof.

3. The memory according to claim 1, wherein the write-in portion is a line perpendicular to each of the magnetic memory lines.

4. The memory according to claim 1, wherein the write-in portion includes a magnetic electrode and a nonmagnetic layer, the nonmagnetic layer being in contact with each of the magnetic memory lines and the magnetic electrode.

5. The magnetic memory according to claim 1, wherein the magnetic detection line includes a ferromagnetic material and an antiferromagnetic material, the antiferromagnetic material being in contact with the ferromagnetic material.

6. The magnetic memory according to claim 1, wherein the spin-wave generator includes a magnetic electrode and a nonmagnetic layer, the nonmagnetic layer being in contact with the magnetic detection line and the magnetic electrode.

7. The magnetic memory according to claim 1, wherein the spin-wave generator includes a second electrode and an insulating layer, the insulating layer being in contact with the magnetic detection line and the electrode.

8. The magnetic memory according to claim 1, wherein the spin-wave detector includes a line, the line being provided in contact with or provided separately from the magnetic detection line.

9. The magnetic memory according to claim 1, wherein the spin-wave detector includes an insulating layer and a magnetic electrode, the magnetic layer being provided via the insulating layer to the magnetic detection line.

10. The magnetic memory according to claim 1, wherein the spin-wave detector includes a voltage-conversion layer, the voltage-conversion layer being provided in contact with the magnetic detection line.

11. The magnetic memory according to claim 1, wherein a width of the magnetic detection line is smaller than a thickness of a domain wall in the magnetic memory lines.

12. The magnetic memory according to claim 1, wherein a width of the magnetic memory lines is smaller than a wavelength of a spin wave propagating in the magnetic detection line.

13. A manufacturing method of a magnetic memory, the memory comprising:
    a plurality of magnetic memory lines, respectively, having a plurality of magnetic domains and domain walls, the domain wall separating the magnetic domain;
    a pair of electrodes provided to both ends of each of the magnetic memory lines, the pair of electrodes to flow a current in each of the magnetic memory lines so as to move the domain walls;
    a write-in portion provided adjacent to each of the magnetic memory lines;
    a magnetic detection line provided so that the magnetic detection line intersects with each of the magnetic memory lines, the magnetic detection line having a single direction of magnetization;
    a spin-wave generator provided to one end of the magnetic detection line, wherein a spin wave generated by the spin-wave generator propagates along the magnetic detection line; and
    a spin-wave detector provided to the other end of the magnetic detection line, the spin-wave detector to detect the spin wave, the spin-wave detector to convert the spin wave into an electrical signal,
the method comprising:
    forming a first magnetic layer above a substrate;
    patterning a first magnetic layer to provide the magnetic memory lines;
    forming a multilayer above the magnetic memory lines, the multilayer including a second magnetic layer, a nonmagnetic layer, and a third magnetic layer;
    patterning the multilayer in a form of a line;
    removing the third magnetic layer to provide the magnetic detection line;
    forming the electrode, the write-in portion, the spin-wave generator, and the spin-wave detector.

14. The memory according to claim 3, wherein a write current is passed through the line, and the write-in portion writes data to a target cell of the magnetic memory lines.

15. The memory according to claim 4, wherein an electron flow (in a direction opposite to that of an electric current) is passed between one of the magnetic memory lines and the magnetic electrode, and the write-in portion writes data to a target cell of the magnetic memory lines.

16. The magnetic memory according to claim 6, wherein a direct current or an alternate current is passed between the magnetic detection line and the magnetic electrode, and a precession of magnetization is generated in the spin-wave generator.

17. The magnetic memory according to claim 7, wherein a voltage with an oscillation frequency is applied by the end of the magnetic detection line, a spin wave is excited in the spin-wave generator.

18. The magnetic memory according to claim 8, wherein the spin-wave detector detects induced electromotive force due to a spin wave in the line.

19. The magnetic memory according to claim 10, wherein the spin-wave detector measures a voltage due to a spin pumping effect and an inverse spin Hall effect, and detects a spin wave as an electric signal.

20. The magnetic memory according to claim 1, wherein the magnetic detection line is composed of any of a semiconductor and an insulator.

* * * * *